United States Patent [19]

Van De Plassche

[11] Patent Number: 5,028,815
[45] Date of Patent: Jul. 2, 1991

[54] CLOCKED COMPARATOR WITH OFFSET REDUCTION

[75] Inventor: Rudy J. Van De Plassche, Eindhoven, Netherlands

[73] Assignee: U. S. Philips Corporation, New York, N.Y.

[21] Appl. No.: 453,638

[22] Filed: Dec. 20, 1989

[30] Foreign Application Priority Data

Jan. 16, 1989 [NL] Netherlands .................. 8900090

[51] Int. Cl.⁵ ............................................. H03K 5/24
[52] U.S. Cl. .................................. 307/355; 307/491; 307/494
[58] Field of Search ............. 307/494, 269, 491, 496, 307/497, 355, 356, 362, 530

[56] References Cited

U.S. PATENT DOCUMENTS 4,553,052 11/1985 Takahashi .................... 307/494
4,707,624 11/1987 Yee ............................... 307/491

FOREIGN PATENT DOCUMENTS 0167517 8/1985 Japan ............................ 307/362

Primary Examiner—John Zazworsky
Attorney, Agent, or Firm—Bernard Franzblau

[57] ABSTRACT

In a clocked comparator with offset reduction, a differential amplifier (5) amplifies the voltage difference between the input terminals (1, 2) and the offset voltage (Voff) in a first state of a clock signal and stores said difference as a charge on the capacitors (C1, C2). In a second state of the clock signal the capacitors are coupled to the inputs (3, 4) of the differential amplifier in such a way that owing to positive feedback the differential amplifier behaves as a flip-flop whose decision threshold is independent of the offset voltage.

13 Claims, 3 Drawing Sheets

CLOCKED COMPARATOR WITH OFFSET REDUCTION

BACKGROUND OF THE INVENTION

This invention relates to a comparator for converting a voltage difference appearing between a first and a second input terminal of the comparator during a first state of a clock signal into a voltage difference appearing between a first and a second output terminal of the comparator during a second state of the clock signal, which comparator comprises:

a differential amplifier having a non-inverting and an inverting input and having an inverting and a non-inverting output, which outputs are coupled to a first and a second output terminal, respectively of the comparator, first and second switching means for coupling the first and the second input terminal to the non-inverting input, and the inverting input respectively, during the first state of the clock signal, a first and a second capacitor coupled between the inverting output and a first node and between the non-inverting output and a second node respectively, and third and fourth switching means for coupling the first node to a first reference voltage terminal and the second node to a second reference voltage terminal, respectively, during the first state of the clock signal.

Such a comparator is known from U.S. Pat. No. 4,553,052. Clocked comparators are employed, inter alia, in analog-to-digital converters. In the first state of the clock signal a differential amplifier in the comparator determines whether an input signal is larger or smaller than a specific reference signal. In the second state of the clock signal a decision is made by transferring the output signal of the differential amplifier into a latch. The resolution of an analog-to-digital converter depends inter alia on the accuracy with which the comparators used therein can distinguish between the input signal and the reference. The accuracy is limited, inter alia, by the offset voltage on the input terminals of the differential amplifier. Therefore, it is desirable to reduce the offset voltage of the differential amplifiers in comparators so as to increase the accuracy of analog-to-digital converters.

In the prior art comparator offset reduction is achieved in that in the first state of the clock signal the voltage difference between the input terminals of the comparator, which is amplified by the differential amplifier, together with the equally amplified offset voltage is stored in capacitors arranged between a reference voltage and the outputs of the differential amplifier. Subsequently, in the second state of the clock signal, the inputs of the differential amplifier are interconnected so that this amplifier now only amplifies its own offset, the capacitors being arranged between the outputs of the differential amplifier and the two output terminals. By adding the charges on the capacitors a voltage difference will be available across the output terminals which is independent of the offset voltage of the differential amplifier. This voltage difference controls a latch which decides which of the two output terminals carries the higher voltage. A disadvantage of this known comparator is that the latch itself also exhibits an input offset so that, although the differential voltage is offset free the decision is subject to inaccuracy. Moreover, such a latch requires an additional number of circuit components.

SUMMARY OF THE INVENTION

It is an object of the invention to provide an accurate comparator with a minimal number of components.

According to the invention, a comparator of the type defined in the opening paragraph is therefore characterized in that the comparator further comprises fifth and sixth switching means for coupling the first node to the inverting input and the second node to the non-inverting input, respectively, during the second state of the clock signal.

If, during the second state of the clock signal, the first and second node are coupled to the inverting input and to the non-inverting input of the differential amplifier, positive feedback is obtained from the outputs to the inputs of the differential amplifier via the capacitors. This amplifier now behaves as a latch whose decision threshold, which determines in which direction the positive feedback drives the outputs of the differential amplifier is independent of the offset voltage. Across the outputs of the differential amplifier this results in a voltage difference which is adequate to provide a reliable drive of further logic circuits. As a result of this circuit arrangement the differential amplifier also functions as a latch so that no separate latch is needed and components are saved.

In a first embodiment the voltage difference between the first and the second input terminal is a balanced signal. If now unequal reference voltages are applied to the first and the second reference terminal this very simply enables the balanced signal on the input terminals of the comparator to be compared with a reference without any d.c. coupling between the difference signal and the reference. Undesirable common-mode signals in the difference signal will then be rejected.

A second embodiment is characterized in that the first and the second reference voltage terminal are interconnected and in that at least one of the first and second input terminals is coupled to the interconnected reference voltage terminals. Here the unbalanced input signal is applied to one of the input terminals. This arrangement has the advantage that no common-mode transient occurs on the inputs of the differential amplifier at the transition from the first to the second state of the clock signal. This enables the accuracy of the comparator to be increased even further.

A third embodiment of the invention is characterized in that the first and the second reference voltage terminal are coupled to the non-inverting input and the inverting input, respectively. This embodiment has the advantage that even more components can be dispensed with in that in the first state of the clock signal the capacitors are not connected to a separate reference voltage source but to the input terminals. The signal sources producing the voltage difference on the input terminal now also act as the reference voltage source.

The length of time of the first and the second state of the clock signal can be reduced by coupling the inverting and the non-inverting output to the first and the second capacitor, respectively via a buffer amplifier. The buffer amplifiers enable the capacitors to be charged and discharged more rapidly, thus allowing the clock frequency to be raised.

BRIEF DESCRIPTION OF THE DRAWINGS

The invention will now be described in more detail, by way of example, with reference to the accompanying drawings in which.

DESCRIPTION OF THE PREFERRED EMBODIMENT

Figure 1:
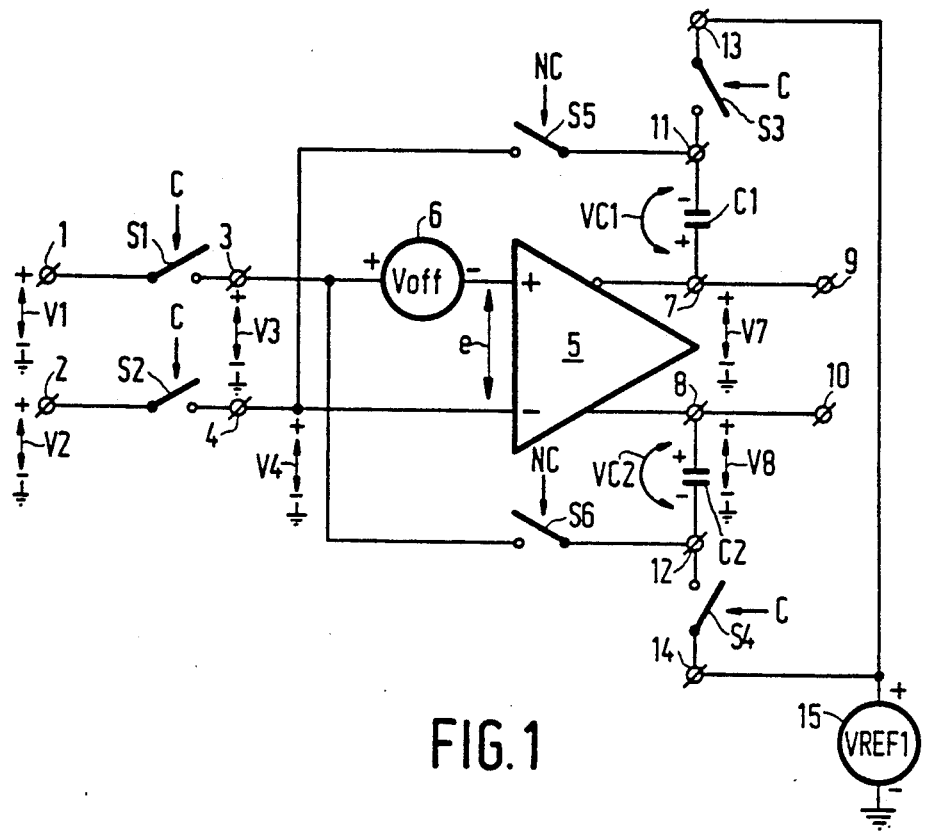
FIGS. 1, 2 and 3 are basic circuit diagrams of comparators in accordance with the invention.

FIG. 1 shows the basic circuit diagram of a first embodiment of a clocked comparator in accordance with the invention. Input voltages V1 and V2 are applied to the input terminals 1 and 2 of the comparator. These voltages, as well as all the other voltages in the present and the following circuit diagrams, are referred to an arbitrarily selected reference potential, which in the present case is ground potential. The input terminals 1, 2 are connected to the non-inverting input 3 and the inverting input 4, respectively, of a differential amplifier 5 via switches S1 and S2, respectively. The differential amplifier has an inverting output 7 connected to the output terminal 9 and a non-inverting output 8 connected to the output terminal 10. An offset voltage source 6 is arranged in series with the non-inverting input 3 and its voltage Voff represents the effective offset of the differential amplifier 5. The capacitor C1 is arranged between the inverting output 7 and a first node 11, which can be connected to a first reference voltage terminal 13 via a switch S3 and to the inverting input 4 via a switch S5. A capacitor C2 is arranged between the non-inverting output 8 and a second node 12, which can be connected to a second reference voltage terminal 14 by a switch S4 and to the non-inverting input by a switch S6. The reference voltage terminals 13, 14 are both connected to a reference voltage source 15 having a voltage value VREF1.

Figure 4:
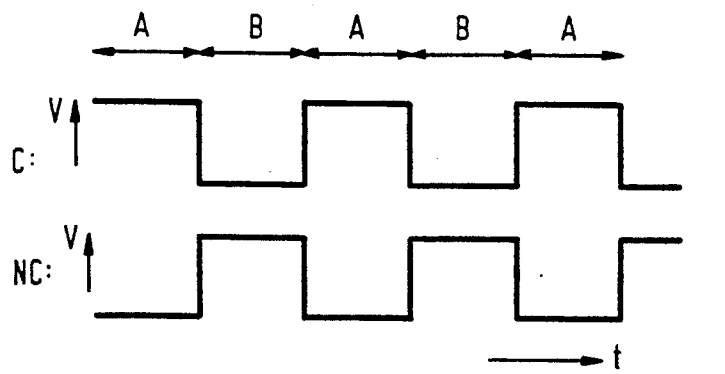
FIG. 4 is an amplitude-versus-time diagram of the clock signals.

The group of switches S1, S2, S3, S4 and the group of switches S5, S6 is opened and closed under command of clock signals C and NC, respectively, whose amplitude-versus-time diagrams are shown in FIG. 4. The signals C and NC are inverted relative to one another. In a first state of the clock signal C, which is indicated by A in FIG. 4, the switches S1, S2, S3 and S4 are closed and the switches S5 and S6 are open. In a second state B of the clock signal C the switches S1, S2, S3 and S4 are open and the switches S5 and S6 are closed. Although in FIG. 4 the length of time of the first state A and the second state B are equal, this is not necessary. The intervals A and B may alternatively have different lengths.

The circuit arrangement operates as follows. During the first state A of the clock signal C the switches S1, S2, S3 and S4 are closed and the switches S5 and S6 are open. The differential amplifier 5 now operates as an amplifier. The compacitors C1 and C2 are connected between the reference voltage source 15 and the outputs 7 and 8 of the differential amplifier 5. The differential amplifier 5 amplifies the voltage difference (V3-V4) across the inputs 3, 4 to provide a voltage difference (V7-V8) across the outputs 7, 8, the offset voltage Voff from the offset voltage source 6 also being amplified.

The relationship between the voltage differences is given by:

$$V7 - V8 = -G*(V3 - V4 - Voff) = -G*e \quad (1)$$

Here, G is the gain of the differential amplifier 5 and e is the effectively amplified difference voltage in accordance with:

$$e = V3 - V4 - Voff \quad (2)$$

Since the switches S1 and S2 are closed $(V1-V2)=(V3-V4)$. The voltage difference between the terminals 7 and 8 is consequently:

$$V7 - V8[ = -G*(V1 - V2 - Voff) \quad (3)$$

The capacitors C1 and C2 are charged by the differential amplifier, a voltage difference VC1 being built up across the capacitor C1 and a voltage difference VC2 being built up across the capacitor C2. These voltage differences comply with the following relationships:

$$VC1 = V7 - VREF1 \quad (4)$$

$$VC2 = V8 - VREF1 \quad (5)$$

$$VC1 - VC2 = V7 - V8 \quad (6)$$

Using the equation (3), equation (6) may be written as follows:

$$VC1 - VC2 = -G*(V1 - V2 - Voff) \quad (7)$$

In the second state B of the clock signal C the switches S1, S2, S3 and S4 are open and the switches S5 and S6 are closed. The comparator is now in the decision phase. The nodes 11, 12 are then connected to the inverting input 4 and the non-inverting input 3 respectively, of the differential amplifier 5. The cross-connection results in a positive feedback so that the differential amplifier now behaves as a flip-flop. As a result of the positive feedback the voltage on one of the outputs 7, 8 will increase to a maximum value and that on the other output will decrease to a minimum value. The decision in which sense the voltage difference across the outputs 7, 8 will develop depends on the initial condition prevailing at the beginning of the second state B of the clock signal. The initial condition is dictated by the voltage difference (V3-V4) on the input terminals 3 and 4 immediately after the beginning of the second state. The following equations are then valid:

$$V7 = VC1 + V4 \quad (8)$$

$$V8 = VC2 + V3 \quad (9)$$

Using equation (1) it follows from (8) and (9) that:

$$V7 - V8 = -G*(V3 - V4) + G*Voff = VC1 - VC2 - (V3 - V4) \quad (10)$$

Since the voltages VC1 and VC2 across the capacitors C1 and C2 cannot change when the second state B begins equation (7) remains valid. Equation (10) may then be reduced to:

$$(V3 - V4) = (-G/(1-G))*(V1 - V2) \quad (11)$$

If the voltages V1 and V2 had been equal to the first state A it follows from equation (11) that the voltage difference V3−V4 will be zero when the second state B begins. In that case the differential amplifier only amplifies its own offset Voff, so that a voltage difference +G*(Voff appears across the outputs 7 and 8. Thus, in fact, the voltage differences appearing across the inputs 3, 4 and the outputs 7, 8 of the differential amplifier do not change in the first and the second state of the clock signal. There is a balance which is maintained until V1 differs from V2. The difference between V3 and V4, as is demonstrated in equation (11), is independent of the offset voltage Voff. If V1 is larger than V2 in the first state A, the voltage on the output 7 will decrease and that on the output 8 will increase in the second state B. This increase and decrease is amplified as a result of the positive feedback so that after a certain time a voltage difference will be available across the outputs 7 and 8, and hence at the output terminals 9 and 10 which are coupled thereto, which voltage difference is limited by the applied supply voltages (not shown) and the design of the differential amplifier. By a suitable choice of the differential amplifier and the supply voltages the voltage difference across the output terminals 9, 10 can be made so large that the logic circuits connected thereto will operate reliably. By connecting one of the output terminals 1, 2 to the reference voltage source 15 and applying the input signal to the other input terminal a comparator circuit is obtained in which no common-mode transients occur at the transition from the state A to the state B of the clock signal. This precludes offset voltage variations as a result of these transients and thus results in an increased accuracy of the comparator. It is to be noted that in the decision phase of the comparator in accordance with the invention the offset voltage Voff does not play a part but that nevertheless the offset voltage will appear on the output terminals 9, 10 in amplified form. Therefore, the offset voltage Voff should not be so high that in the second state B of the clock signal the amplified offset voltage G*Voff largely occupies the output voltage swing on the outputs 7, 8 and thus approximates to the logic swing of the connected logic circuits. In practice this requirement is nearly always met.

Figure 2:
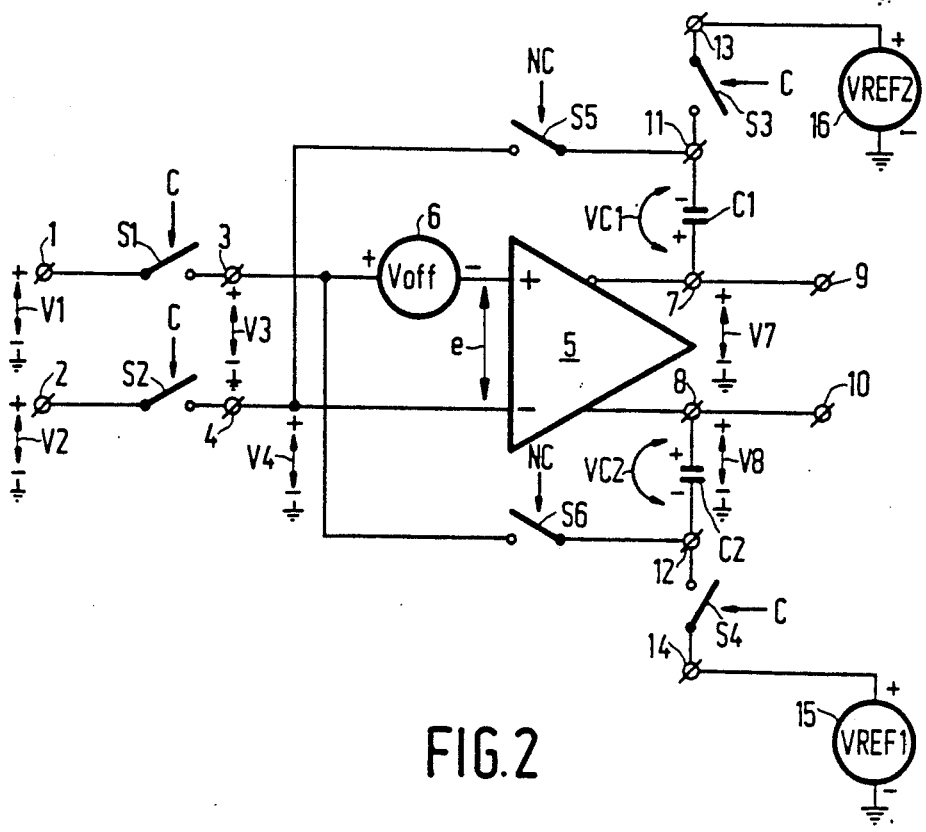

FIG. 2 shows a second embodiment. In this embodiment the reference voltage terminal 13 is connected to a reference voltage source 16 whose reference voltage has a value VREF2 and the reference voltage terminal 14 is connected to a reference voltage source 15 whose reference voltage has a value VREF1. Equations (4), (5) and (6) then change accordingly to:

$$VC1 = V7 - VREF2 \quad (4')$$

$$VC2 = V8 - VREF1 \quad (5')$$

$$VC1 - VC2 = V7 - V8 - VREF2 + VREF1 \quad (6')$$

so that equation (7) changes to:

$$VC1 - VC2 = -G(V1 - V2 - Voff) - Vref1 + Vref2 \quad (7')$$

Insertion of equation (7') into equation (10) then yields a new equation (11):

$$V3 - V4 = (-G/(1-G)*(V1-V2) + (VREF1 - VREF2)/G \quad (11')$$

By selecting VREF1 to differ from VREF2, the decision threshold of the comparator can be shifted. The input signals V1, V2 on the input terminal can now form a balanced difference signal, the common mode component in the deference signal being suppressed by a suitable choice of VREF1 and VREF2. The input signal is now fully floating relative to the comparator and the reference voltages.

Figure 3:
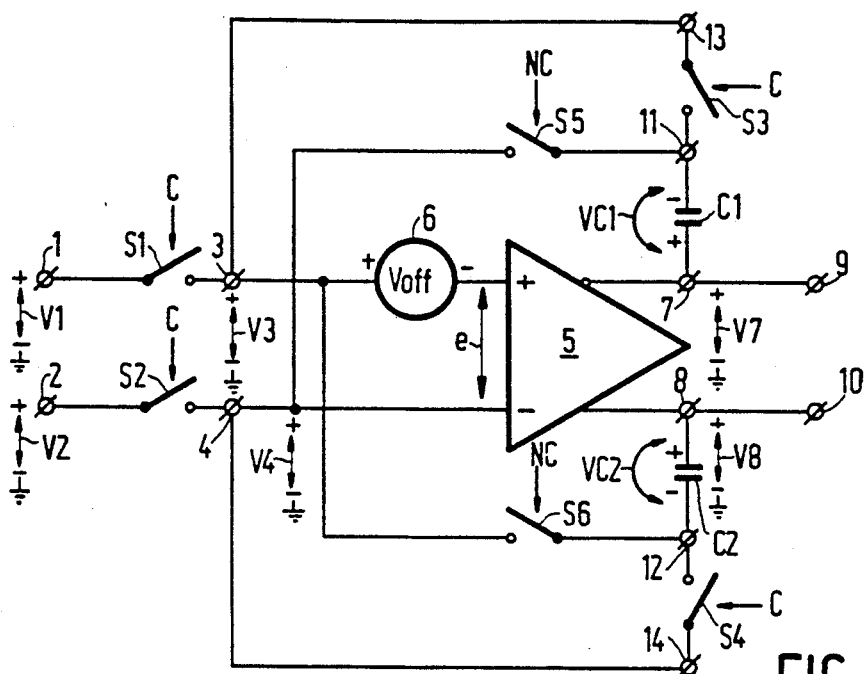

FIG. 3 shows a third embodiment. Now the reference voltage terminal 13 is connected to the non-inverting input 3 and the reference voltage terminal 14 is connected to the inverting input 4. In the first state A of the clock signal the signals V1 and V2 are used as VREF2 and VREF1, respectively, so that now:

$$VREF1 = V2 \quad (12)$$

$$VREF2 = V1 \quad (13)$$

Equation (11') now changes to:

$$V3 - V4 = (G^2 + 1)/(G^2 - G)*(V1 - V2) \quad (11'')$$

Again the decision is independent of the input offset voltage Voff. In this modification of the circuit arrangement the signal sources V1 and V2 are loaded capacitively during the first state A of the clock signal. The reference voltage sources are now dispensed with so that components are saved.

Figure 5:
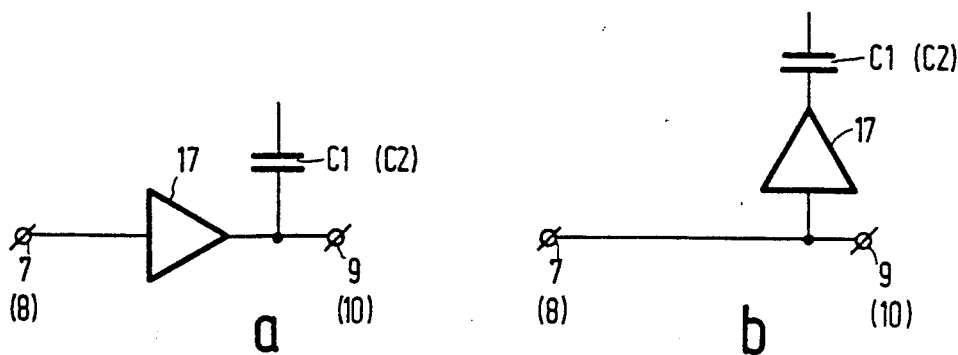
FIG. 5 shows circuit diagrams of extensions of the comparators in accordance with the invention.

In all of the embodiments shown, if necessary or desirable, it is possible to speed up charging of the capacitors by arranging additional buffer amplifiers between the outputs 7 and 8 and the capacitors C1 and C2, respectively. FIGS. 5a and 5b show two possible arrangements for the buffer amplifier. In FIG. 5a the input of the buffer amplifier 17 is connected to the inverting output 7 and both the capacitor 1 and the output terminal 9 are connected to the output of the buffer amplifier 17. In FIG. 5b only the capacitor C1 is connected to the output of the buffer amplifier 17. A buffer amplifier for the capacitor C2 is arranged correspondingly.

Figure 6:
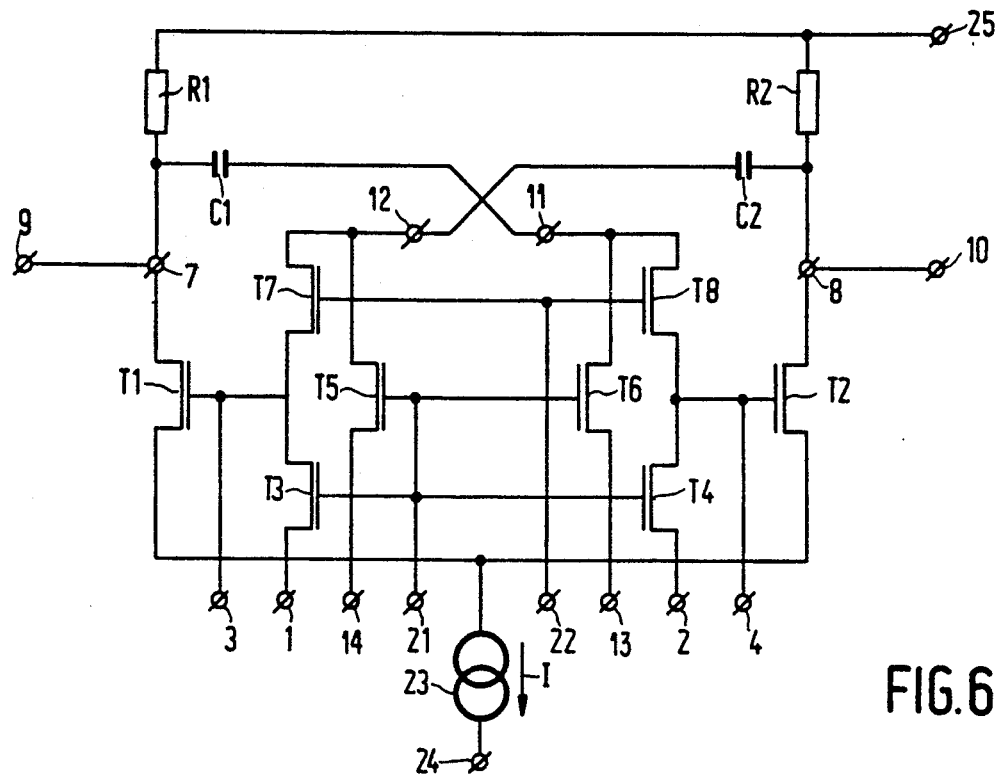
FIGS. 6 and 7 are circuit diagrams of embodiments of a comparator in accordance with the invention.

FIG. 6 shows the circuit diagram of an embodiment of a comparator in accordance with the invention comprising MOS transistors. In this Figure corresponding reference numerals and letters have the same meaning as in FIGS. 1, 2 and 3. The transistors each have a first and a second main electrode and a control electrode, which electrodes correspond to the source, the drain and the gate respectively of a MOS transistor. The sources of the transistors T1 and T2 are both coupled to a first supply terminal 24 via a current source 23. The transistors T1 and T2 are arranged as a differential amplifier. The drains of the transistors T1 and T2 are connected to a second supply voltage terminal 25 via resistors R1 and R2, respectively, to the nodes 11 and 12 respectively via a capacitor C1 and C2, respectively, and to the output terminals 9 and 10, respectively. The gates of the transistors T1 and T2 constitute the non-inverting input 3 and the inverting input 4, respectively, of the differential amplifier, while the drains constitute the inverting output 7 and the non-inverting output 8 which are connected to the output terminals 9 and 10, respectively. The transistors T3, T4, T5, T6, T7 and T8 operate as switches and correspond to S1, S2, S4, S3, S6 and S5 respectively in the circuit arrangements shown in FIGS. 1, 2 and 3. A main current path between the source and the drain of each of the transistors T3–T8 is driven into conduction by applying a suitable voltage on the gate of the relevant transistor. The gates of the transistors T3, T4, T5 and T6 are all connected to a first control terminal 21, to which a suitable clock signal C is applied. The gates of the transistors T7 and T8 are both connected to a second control terminal 22, to which the inverted clock signal NC is applied. The main current path of the transistors T3 and T4 are connected between a first input terminal 1 and the gate of the transistor T1 and between a second input terminal 2 and the gate of the transistor T2, respectively. The main current path of the transistor T6 is arranged between a first reference voltage terminal 13 and the first node 11, and the main current path of the transistor T5 is arranged between a second reference voltage terminal 14 and the second node 12. The main current path of the transistors T7 and T8 are arranged between the gate of the transistor T1 and the second mode 12 and between the gate of the transistor T2 and the first node 11, respectively. The input voltages V1 and V2 are applied to the input terminals 1 and 2, respectively. Equal reference voltages VREF1 can be applied to each of the first and second reference voltage terminals 13 and 14. Alternatively, unequal reference voltages VREF2, VREF1 can be applied to the first and the second reference voltage terminals 13 and 14. In both cases it is possible to connect one of the two input terminals to one of the two reference terminals. If, for example, the input terminal 2 and the two reference voltage terminals 13 and 14 are all connected to the same reference voltage, no common mode transients will occur in the signals on the gates of the transistors T1 and T2 at the transition from the first to the second state of the clock signal C. This may improve the accuracy of the comparator because common-mode transients can affect the input offset voltage of the differential amplifier T1, T2. The embodiment shown in FIG. 3 can be realised by means of the circuit shown in FIG. 6 by connecting the reference terminal 13 to the terminal 3 and the reference terminal 14 to the terminal 4. The buffer amplifier 17 in FIGS. 5a and 5b may be constructed in any suitable manner, example by means of a MOS transistor arranged as a source follower.

Figure 7:
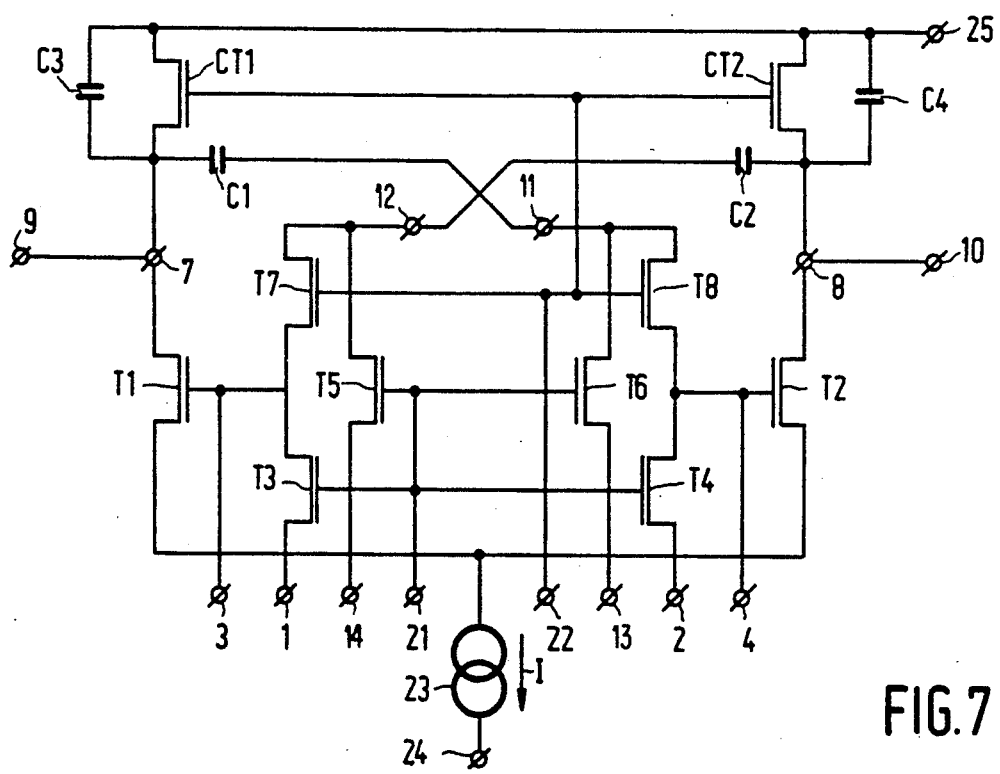

Instead of resistors other resistance means may be selected for R1 and R2, such as, for example resistor-connected field effect transistors of a conductivity type complementary to that of the transistor T1, T2. A special embodiment comprising such complementary transistors is shown in FIG. 7. In this Figure corresponding parts bear the same reference numerals as in FIG. 6. Instead of the resistors R1 and R2 the main current paths of the complementary transistors CT1 and CT2 are now arranged between the drain of the transistor T1 and the second supply voltage terminal 25 and between the drain of the transistor T2 and the second supply voltage terminal 25. The gates of the complementary transistors CT1 and CT2 are both connected to the second control terminal 22, to which the inverted clock signal NC is applied. In the first state A of the clock signal C the transistors CT1 and CT2 conduct and behave as a load resistance for the differential amplifier T1, T2. Capacitors C3 and C4 are arranged in parallel with the main current paths of CT1 and CT2 respectively or may be formed by parasitic capacitances. In the second state B of the clock signal C, CT1 and CT2 are cut off. The charge built up in the capacitors C3 and C4 in the first state now drives the differential amplifier T1, T2, which operates as a latch in the second state. In this way the loop gain in the second state is increased, resulting in a higher sensitivity of the comparator.

The invention is not limited to the embodiments shown herein. The differential amplifier can also be realised in a variety of other ways. It is also possible to select bipolar transistors having high current gain factors for the transistors T1 and T2. The switches S1–S6 can be constructed by means of any suitable transistor or transistor combination.

I claim:

1. A comparator for converting a voltage difference appearing between a first and a second input terminal of the comparator during a first state of a clock signal into a voltage difference appearing between a first and a second output terminal of the comparator during a second state of the clock signal, wherein the comparator comprises:
    a differential amplifier having a non-inverting input and an inverting input and having an inverting output and a non-inverting output, which outputs are coupled to the first and the second output terminal, respectively, of the comparator,
    first and second switching means for coupling the first and the second input terminal to the non-inverting input and the inverting input, respectively, during the first state of the clock signal,
    a first and a second capacitor coupled between the inverting output and a first node and between the non-inverting output and a second node, respectively,
    third and fourth switching means for coupling the first node to a first reference voltage terminal and the second node to a second reference voltage terminal, respectively, during the first state of the clock signal, and
    fifth and sixth switching means for coupling the first node to the inverting input and the second node to the non-inverting input, respectively, during the second state of the clock signal.

2. A comparator as claimed in claim 1, wherein the voltage difference between the first and the second input terminal is a balanced signal.

3. A comparator as claimed in claim 1, wherein the first and the second reference voltage terminal are interconnected and in that at least one of the first and second input terminals is coupled to the interconnected reference voltage terminals.

4. A comparator as claimed in claim 1, wherein the first and the second reference voltage terminal are coupled to the non-inverting input and the inverting input, respectively.

5. A comparator as claimed in claim 1 wherein the inverting output and the non-inverting output are coupled to the first and the second capacitor, respectively, via a buffer amplifier.

6. A comparator as claimed in claim 1 wherein the differential amplifier comprises a first and a second transistor arranged as a differential pair, each transistor having a first and a second main electrode and a control electrode, the first main electrodes being interconnected to a common coupling point and via a current source to a first supply voltage terminal, the control electrode of the first and the second transistor are coupled to the non-inverting input and the inverting input, respectively, the second main electrode of the first transistor is coupled to the inverting output and, via first resistance means, to a second supply voltage terminal, and a second main electrode of the second transistor is coupled to the non-inverting output and, via second resistance means, to the second supply voltage terminal.

7. A comparator as claimed in claim 6 wherein the first to the sixth switching means, respectively, comprise a third to an eighth transistor each having a control electrode, a first and a second main electrode and a main current path between the first and the second main electrode, the main current paths of the third to the eighth transistor being coupled between the first input terminal and the non-inverting input, the second input terminal and the inverting input, the first node and the first reference voltage terminal, the second node and the second reference voltage terminal, the first node and the inverting input, the second node and the non-inverting input, respectively, the control electrodes of the third, the fourth, the fifth and the sixth transistor being coupled to a first control terminal arranged to receive the clock signal, and the control electrodes of the seventh and the eighth transistor being coupled to a second control terminal arranged to receive an inverted clock signal.

8. A comparator as claimed in claim 7, wherein the first and the second resistance means comprise a ninth and a tenth transistor, respectively, each of a conductivity type complementary to that of the first and the second transistor, each having a control electrode, a first and a second main electrode and a main current path between the first and the second main electrode, the control electrodes of the ninth and the tenth transistor being coupled to the second control terminal, and the main current path of the ninth and the tenth transistor being connected between the second supply voltage terminal and the second main electrode of the first transistor and the second transistor, respectively, and being shunted by a third and a fourth capacitor, respectively.

9. A comparator as claimed in claim 3 wherein the inverting output and the non-inverting output are coupled to the first and the second capacitor, respectively, via a buffer amplifier.

10. A comparator as claimed in claim 1 characterized in that the differential amplifier comprises a first and a second transistor connected together as a differential pair, the first to the sixth switching means, respectively, comprise a third to an eighth transistor each having a control electrode, a first and a second main electrode and a main current path between the first and the second main electrode, the main current paths of the third to the eighth transistors being coupled between the first input terminal and the non-inverting input, the second input terminal and the inverting input, the first node and the first reference voltage terminal, the second node and the second reference voltage terminal, the first node and the inverting input, the second node and the non-inverting input, respectively, the control electrodes of the third, the fourth, the fifth and the sixth transistors being coupled to a first control terminal arranged to receive the clock signal, and the control electrodes of the seventh and the eighth transistors being coupled to a second control terminal arranged to receive an inverted clock signal.

11. A comparator as claimed in claim 6 further comprising a first control terminal arranged to receive the clock signal and a second control terminal arranged to receive an inverted clock signal, characterized in that the first and the second resistance means comprise a third and a fourth transistor, respectively, each of a conductivity type complementary to that of the first and the second transistor, each having a control electrode, a first and a second main electrode and a main current path between the first and the second main electrode, the control electrodes of the third and the fourth transistor being coupled to the second control terminal, and the main current paths of the third and the fourth transistors being connected between the second supply voltage terminal and the second main electrode of the first transistor and the second transistor, respectively, and being shunted by a third and a fourth capacitor, respectively.

12. A comparator as claimed in claim 1 wherein the first and second reference voltage terminals comprise the non-inverting input and the inverting input, respectively, of the differential amplifier.

13. A clocked comparator circuit comprising:
   first and second transistors coupled together to form a differential amplifier wherein a first main electrode of the first and second transistors comprise an inverting output and a non-inverting output, respectively, of the comparator circuit, and control electrodes of the first and second transistors are coupled via first and second switching means, respectively, to first and second comparator circuit input terminals, respectively, during a first state of a clock signal which controls said first and second switching means,
   first and second capacitors coupled between the inverting output and a first circuit node and between the non-inverting output and a second circuit node, respectively,
   third and fourth switching means for coupling the first and second circuit nodes to at least one reference voltage terminal, respectively, during the first state of the clock signal, and
   fifth and sixth switching means for coupling the first circuit node to an inverting input of the differential amplifier and the second circuit node to a non-inverting input of the differential amplifier, respectively, during a second state of the clock signal.

* * * * *